United States Patent

[11] 3,605,004

[72] Inventor Martin I. Grace
Framingham, Mass.

[21] Appl. No. 46,708
[22] Filed June 16, 1970
[45] Patented Sept. 14, 1971
[73] Assignee Sperry Rand Corporation

[54] HIGH EFFICIENCY DIODE SIGNAL GENERATOR
11 Claims, 5 Drawing Figs.

[52] U.S. Cl. ........................................ 321/69 W, 330/4.9, 333/73 W, 333/98 R
[51] Int. Cl. ........................................ H02m 5/16
[50] Field of Search ........................................ 321/69 NL, 69 W, 330/4.9; 307/88.3; 333/31 A, 73 W, 83 R, 98 R

[56] References Cited

UNITED STATES PATENTS

| | | | |
|---|---|---|---|
| 2,954,468 | 9/1960 | Matthaei ...................... | 321/69 W |
| 3,534,244 | 10/1970 | Broundley .................... | 321/69 W |

*Primary Examiner*—Gerald Goldberg
*Attorneys*—S. C. Yeaton and Reginald V. Craddock

ABSTRACT: A microwave of high-frequency amplifier or frequency converter which exploits and open-faced nonradiating wave-guiding circuit configuration for efficient interaction with a semiconductor high-efficiency-mode diode. Because of the geometrical nature of the circuit, manufacture and adjustment of the amplifier are facilitated.

INVENTOR.
MARTIN I. GRACE
BY
H P Terry
ATTORNEY

INVENTOR.

MARTIN I. GRACE

BY

H P Terry

ATTORNEY

HIGH EFFICIENCY DIODE SIGNAL GENERATOR

The invention herein described was made in the course of under a contract or subcontract thereunder with the Department of the Navy.

BACKGROUND OF THE INVENTION

1. Field of the Invention

The invention pertains to the art of efficient generation of microwave or high-frequency signals in transmission line devices. More particularly, the invention pertains to means for efficient amplification of or frequency conversion or multiplication of such microwave or high-frequency signals with simple, compact, readily adjustable, and inexpensive transmission line elements cooperating with active elements such as semiconductor diodes and operating without dissipation of energy in the quiescent state. 2. Description of the Prior Art High-frequency oscillations have often been observed in systems combining cavity or other resonator or high-frequency transmission lines with active semiconductor diodes exhibiting negative resistance effects when placed in suitable electrical bias fields. Furthermore, circuits suitable for improved operation employing high-efficiency-mode diodes have been devised, both in coaxial line form and in hollow wave guide form, and have been successfully demonstrated for operation particularly in the region below 8 GHz.

It is the function of such circuits as effectively interact with high-efficiency-mode diodes to provide both fundamental and harmonic energy at the high-efficiency-mode diode in the particular relation required by the diode for efficient energy conversion. In other words, the improved circuit must be capable of placing the diode in an oscillating electromagnetic field simultaneously having electric components at a fundamental frequency $\omega_F$ and at harmonic $\omega_H$ thereof.

At frequencies $\omega_F$ above 8 GHz. Otherwise suitable coaxial line and hollow wave guide circuits become difficult to make and to adjust because of their small size. The problems associated with devising suitable means of independently matching, tuning, and otherwise adjusting the individual parts of the circuit in which fundamental and harmonic signals mutually or separately flow become increasingly difficult, if not impossible, of solution.

SUMMARY OF THE INVENTION

The invention is a microwave or high-frequency signal amplifier or frequency converter employing a high-efficiency-mode semiconductor diode as an active negative resistance device in a multiply tuned open-faced transmission line circuit. Impedance matching devices, consisting of conductive or dielectric elements, and located in a novel manner between the diode and the external load, are used to adjust the circuit for high-efficiency-mode diode operation. Such matching devices interact with the fields adjacent an internal portion of the open faced transmission line to which the active diode is connected in series relation.

In operation, a unidirectional potential is applied across the high-efficiency-mode semiconductor diode such that it is biased near its break down level. The high-frequency or microwave signal, when superimposed upon the bias potential, produces large changes in the instantaneous diode voltage and current, which changes are such that a large negative resistance is generated at the same frequency as the fundamental frequency $\omega_F$ of the applied high-frequency signal. The current wave contains many harmonic components which are also coupled to the oscillating harmonic high-frequency field to produce amplified harmonic signals, thereby improving the conversion efficiency of the diode.

DESCRIPTION OF THE PREFERRED EMBODIMENT

Figure 1:
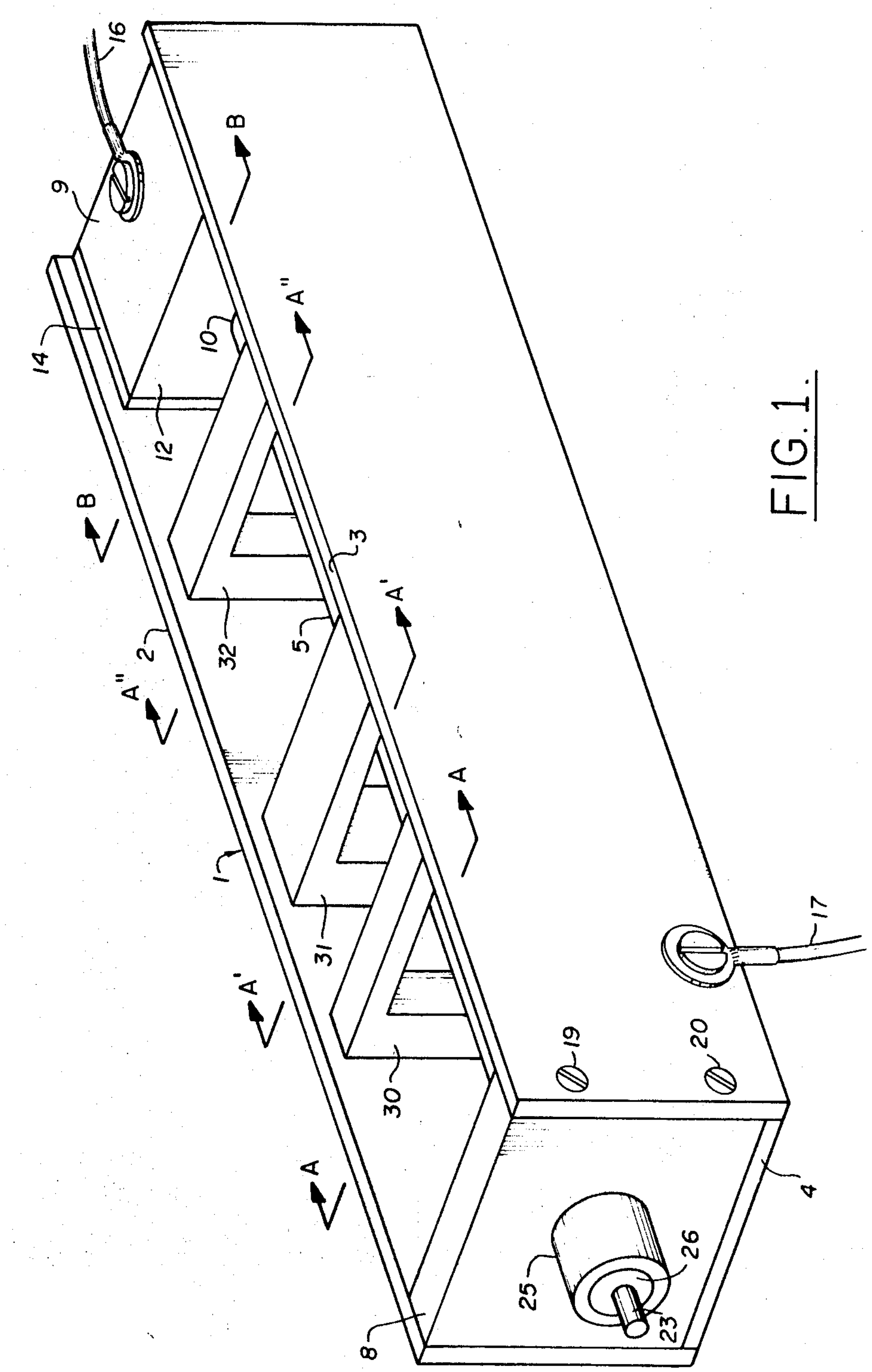
FIG. 1 is a perspective view of the preferred embodiment of the invention.

FIG. 1 to 4 show a signal converter or amplifier and frequency multiplier according to the present invention comprising a section of open-faced transmission line 1. The preferred form of transmission line 1 is an open-faced structure having three connected closed walls 2, 3, and 4, walls 2 and 3 being mutually parallel to each other and mutually perpendicular to wall 4. The inner surface of wall 4 is provided with a centrally located reentrant partition or septum 5, extending from an along a major portion of wall 4, as seen particularly in FIG. 2, and having ends 6 and 7. The septum 5 is lower in height than walls 2 and 3 and forms a symmetric geometrical structure with walls 2, 3, and 4 having a cross section generally like the upper case letter E placed on its side (see FIGS. 3 and 4). Septum 5 is so constructed and arranged relative to walls 2, 3, and 4 that the combination supports propagation of traveling high-frequency wave energy within the confines of the combination without substantial loss of energy due to radiation. Propagating energy is largely confined in or bound within the structure in what may be called the the $TE_{01}$ propagation mode illustrated, for convenience, in FIG. 5. It is seen that the instantaneous electric filed lines flow from the opposed conducting surfaces of septum 5 to the respective conductive adjacent inner surfaces of walls 2 and 3, that they are symmetric about the plane of septum 5, and that there is very little electric field above the top of septum 5 so that radiation of electromagnetic energy is minimized. The open-faced, boxlike structure is completed by end walls 8 and 9, whose functions will be further discussed. As is usual in high-frequency circuits, the respective current carrying surfaces of septum 5 and walls 2 and 3 and their end connecting walls 8 and 9 have good electrical conductivity for high-frequency electrical currents.

Figure 2:
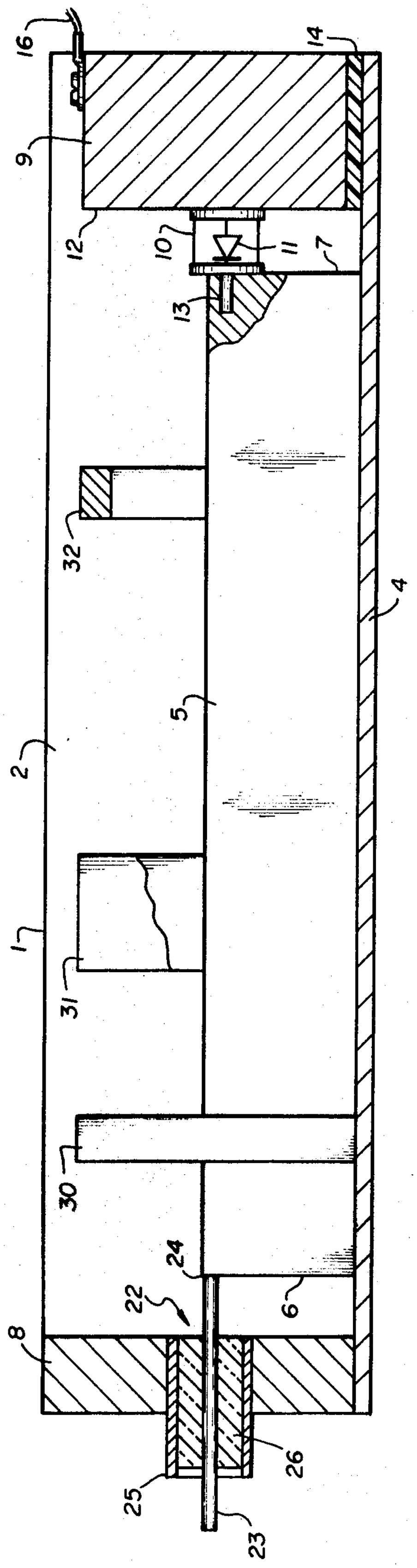
FIG. 2 is an elevation view, partly in cross section, of the apparatus of FIG. 1.

Referring particularly to FIGS. 1 and 2, there is placed in series with the septum 5 at its end 7 a high-efficiency-mode diode 10 whose particular detailed characteristics remain to be described. Diode 10 is poled as symbolically indicated by the representation 11 shown as if actually drawn on the surface of the diode package. At one end, diode 10 is supported in any convenient conventional manner from surface 12 of end wall 9, as by being cemented in place thereon or otherwise held in place by known means. Opposite surface 12, diode 10 is equipped with a short lead 13 conductively fitting within a hole drilled in the end 7 of septum 5.

Figure 4:
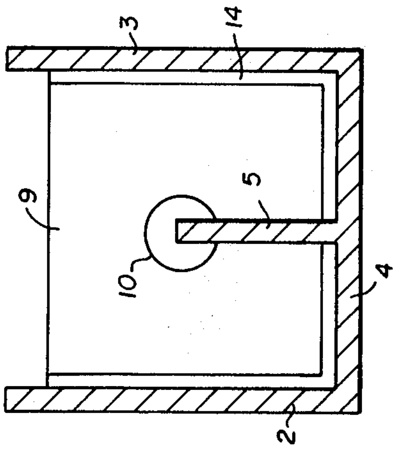
FIG. 4 is a cross section view taken at line B—B of FIG. 1.

End wall 9, in addition to closing transmission line 1 and supporting diode 10, is used to provide an appropriate bias voltage thereto. As seen in FIGS. 1, 2, and 4, end wall 9 is insulated from the transmission line walls 2, 3, and 4 and also supported therein by a thin strip of suitable dielectric material 14. Any suitable bonding agent may be used for fixing such a relation of walls 2, 3, and 4, strip 14, and end wall 9. Thus, wall 9 and dielectric strip 14 form a shorting means for high-frequency energy, so that such energy cannot flow out of line 1 past wall 9. In addition, the arrangement operates so that a bias voltage may be supplied by a bias source (not shown) between leas 16 attached to wall 9 and any other part of the apparatus, such as lead 17 in FIG. 1. It is to be understood that many types of diode packages are available and that the particular package illustrated is merely a representative one selected for ease of illustration.

At the end of transmission line 1 opposite wall 9 is placed a second conductive end wall 8, held in place by suitable means such as screws 19 and 20. As seen in FIGS. 1 and 2, wall 8 is supplied with an aperture through which passes coaxial transmission line 22. Line 22 includes an inner conductor 23, conductively joined at junction 24 to the end 6 of septum 5 and passing through the aperture in end wall 8. Coaxial line 22 is further supplied with an outer conductor 25, concentrically surrounding inner conductor 23, and conductively affixed within wall 8. Conductors 23 and 25 may be established permanently in set relation by an insulating bead 26. Coaxial line 22 and septum 5 are so arranged and so constructed according to established practice as to form a suitable impedance match over the desired operating frequency band. Other known impedance transition elements, such as tapered transitions, may be substituted for the illustrated arrangement in a manner well known in the art.

It is to be understood that coaxial line 22 may be used in one or another way depending on the manner of operation of the apparatus. When operated as self-excited oscillator, the coaxial line 22 provides means for supplying energy at frequency $\omega_F$ to useful load. On the other hand, the device may be used as a single port amplifier in the well known manner by coupling a circulator to line 22. Then, one port of the circulator is used to inject signals to be amplified into the apparatus, while a second port of the circulator provides an output.

Figure 3:
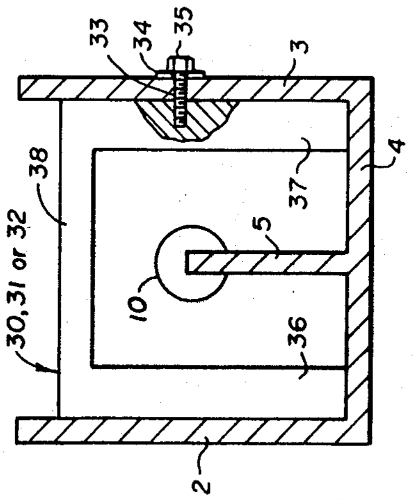
FIG. 3 is a cross section view taken either at line A—A, line A'—A', or A''—A'' of FIG. 1.

At certain intervals within the above-described structure are placed adjustable tuning or transforming elements 30, 31, and 32. The susceptance matching or transforming element 30, for instance, may comprise as seen from FIGS. 1, 2, and 3 a symmetric conducting FIG. shaped generally like an inverted square-cornered letter U with similar legs 36 and 37 and an integral bridging portion 38. As seen in FIG. 3, arms 36 and 37 respectively bear against the inner conducting surfaces of walls 2 and 3 and element 38 forms a bridging portion over septum 5 in a region of minimal electric field. The tuning element, as seen in FIG. 3, may be provided with means permitting it to be moved longitudinally within transmission line 1 in contact with the inner surface thereof. A short longitudinal slot 33 through the wall 3 permits element 30 to be adjusted and and then to be fixed in position by tightening a screw 35 against washer 34, screw 35 being threaded into a mating threaded hole in element 30. The position of the similarly formed tuning element 31 (FIGS. 1 and 2) may also be adjusted longitudinally and then fixed by virtue of a similar slot, washer, and screw combination. A third and similarly formed tuning element 32 operates in the same manner.

Figure 5:
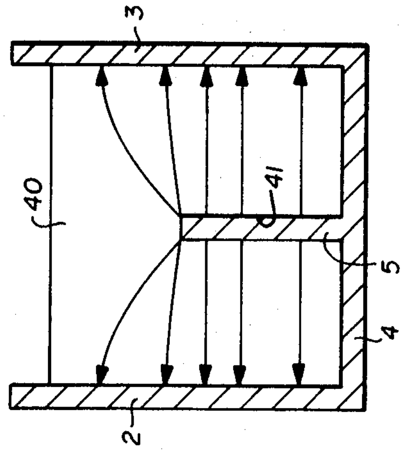
FIG. 5 is a view in cross section taken either at line A—A, line A'—A', or line A''—A'' of FIG. 1 showing an alternative construction.

In place of the metallic electrically conducting slug tuning or impedance-matching elements 30, 31, and 32, dielectric tuning devices may be employed. FIG. 5 illustrates such a device as constructed of a suitable dielectric material having low loss characteristics at the high frequencies involved. In FIG. 5, the matching element 40 is a parallel-sided slab of dielectric material generally shaped like the tuning element 30 of FIG. 3 in that it contacts walls 2, 3, and 4 of the transmission line 1, but different in that it may more completely fill the respective spaces between walls 2 and 3 and septum 5. In FIG. 5, it is seen that the slab 40 has a slot 41 so that the slab fits over septum 5 and touches the inner surfaces of septum 5. The dielectric slab 40 may be arranged to be adjusted in position and held in position by means similar to slot 33, washer 34, and screw 35. If desired, the latter elements may be constructed of dielectric material.

The kind of diode known generally as the avalanche transit time diode has been found to have characteristics suitable for use in the invention as diode 10. It may be used either in the form known as the impact avalanche transit time diode, for which the accepted acronym is the IMPATT diode, or in the form of the trapped plasma avalanche triggered transit diode known as the TRAPATT diode. For example, diode 10 may be an epitaxial silicon or other pn or step or abrupt junction diode or a pnn punch-through diode designed such that, with an electric filed of suitable amplitude present, the field punches through a substrate at reverse break down. Such diodes have, for example, been described as being successfully formed by diffusing boron from a boron-nitride source into a phosphorous doped epitaxial material on a heavily doped antimony substrate. The thickness of the epitaxial layer is varied by etching, prior to diffusion, so as to produce either the abrupt pn structure or the pnn+structure.

The transmission line circuit employed in the apparatus of FIGS. 1 and 2 has several beneficial attributes for use in apparatus operating for example, above 8 GHz. First, it is readily fabricated and, having one open side, is materially easier to employ at very high frequencies. While otherwise having certain useful characteristic generally like those of coaxial transmission line and like other conventional hollow (but closed) wave-guiding structures, it has large power-handling capabilities, is mechanically simple, has a greater band pass than rectangular wave guide, and is readily coupled to coaxial line.

Of substantial significance is its open-faced geometry and the fact that the structure has a relatively large, easily accessible interior, as compared, for instance, with coaxial transmission line. The large effective interior reduces losses, improving the quality factor Q of the circuit. The configuration, being open and having no substantial tendency to radiate, permits use of relatively low impedance tuners and permits easy manual adjustment and setting of the impedance matching and other elements. Such manual adjustment may be made with the parts being adjusted in full view, and without substantial confusing effects on the oscillating fields within the apparatus. The tuning elements may after optimum adjustment easily be fixed permanently in position. Manufacturing and assembly tolerances may be relaxed. Since there is substantially no radiation from the open face, a cover sheet (either metallic or dielectric) may be placed over the open face of the apparatus after adjustment is accomplished to prevent the degrading effects of direct exposure to the atmosphere.

One theory of operation of the invention may be advanced for providing a further understanding of the invention. It is to be understood that the theory is offered only for explanatory purposes and is not to be interpreted in a limiting sense. For example, the inventive apparatus involves a distributed circuit operating with currents flowing simultaneously at a fundamental frequency $\omega_F$ and at several of its harmonics $\omega_H$. With such a spread of high frequencies, it is not possible accurately to discuss operation of the invention in terms of a single lumped constant equivalent circuit. It is therefore to be understood that the following explanation is offered only to illustrate in a qualitative manner the mode of operation of the invention.

The primary function of the slug tuning elements or impedance transformers 30, 31, and 32 is to form a microwave filter network whose input impedance $Z(\omega)$ and power transfer function $H(\omega)$ are such that:

1. the diode is resonant at the output frequency $\omega_F$ and its harmonics $\omega_H$, particularly at the first two harmonics thereof, 2. the transfer function $H(\omega)$ of the microwave filter is such that the filter exhibits a pass band at the desired output frequency $\omega_F$ so that to permit energy of a frequency $\omega_F$ to reach any load attached to coaxial line 22, and 3. the filter network comprising the slug tuners 30, 31, and 32 is such that the transfer function $H(\omega)$ exhibits a stop band at the harmonic frequencies $\omega_H$ so as to prevent energy at frequency $\omega_H$ from reaching the load. This enchances the harmonic content of the electric field across diode 10. If desired, the filter network may be adjusted so as to permit flow of energy at frequency $\omega_H$ which is a harmonic of frequency $\omega_F$ into the load.

When the amplified signals of frequency $\omega_F$ are to be generated, the external signal at frequency $\omega_F$ is applied through a circulator located at the input to the filter. This is permissible since this frequency is within the pass band of the filter circuit. Transformers of the dielectric type shown in FIG. 5 function is substantially the same manner with the exception that the tuning elements are formed by increasing the dielectric constant, rather that changing the geometry as is done with the metallic tuners.

While the exact locations and lengths along transmission line 1 of transformers 30, 31, and 32 and of of the parameter determining elements of the apparatus are not readily established by theory, experimental adjustment of such parameters enables operation of the diode 10 in the desired high-efficiency mode, and the efficient extraction of fundamental and harmonic energy from the apparatus. Such high-efficiency-mode operation of diode 10 is made possible because the circuit configuration causes resonant fields to appear across diode 10 at the operational fundamental frequency $\omega_F$ plus resonant fields of at least the first two of its harmonic frequencies $\omega_H$.

Assume the presence of an electrical field of frequency $\omega_F$ within transmission line 1. A unidirectional bias field is applied across diode 10, being derived as previously explained, from any conventional bias source placed on leads 16 and 17. The bias signal is preferably adjusted so that the voltage across diode 10 is within a very few volts of the reverse break down point for diode 10. In the quiescent state, with no input signal at frequency $\omega_F$ present, substantially no unidirectional current flows through diode 7, and substantially no power is used and thus wasted. Undesired power consumption and heating of diode 10 is avoided. When high-frequency energy at frequency $\omega_f$ is admitted to the apparatus via coaxial line 22, the electric field across the junction of diode 10 is the sum of a unidirectional bias field component and the alternating field component of the high-frequency signal $\omega_F$. Whenever the time rate of increase and the peak total field across diode 10 exceed critical values, an avalanche shock wave is generated, causing the electric field within diode 10 to fall instantaneously to a very low value.

Consequently, a large current impulse is allowed to flow from the diode 10 bias source through diode 10. This current surge is abrupt and therefore is rich in harmonic content, so that a harmonic signal electric field of frequency $\omega_F$ also appears across diode 10 and is readily coupled from the transmission line 1 and coaxial line 22. Amplification of the signal obtains because the relatively small excursions of the $\omega_F$ signal, swinging only a few volts relative to the break down voltage of diode 10, trigger relatively large swings in current flowing through diode 10. Because the wide diode current swing from a value of substantially zero, amplification and frequency multiplication is an efficient process.

For example, the invention operates as an amplifier of X band energy injected through a circulator to a surprising 4.8 percent bandwidth at X-band. Broad band pulsed operation in the high-efficiency mode as an amplifier has been achieved. The 3 db. bandwidth of 4.8 percent at 8.6 GHz. was measured for a midband gain of 8 db. The peak power output was 2 watts and the DC to RF conversion efficiency was 12 percent at midband. In another form, the invention has yielded a 6 watt output power at 10 GHz. with 3.5 percent efficiency.

It should be understood that, while the invention arose in a search for efficient transmission line circuit configuration for use, say, above 8 GHz., that the invention is also useful below 8 GHz. also, particularly because of the fact that its demonstrated bandwidth is considerably greater than the theoretically predicted value.

While the invention has been described in its preferred embodiment, it is to be understood that the words that have been used are words of description rather than limitation and that changes within the purview of the appended claims may be made without departing from the true scope and spirit of the invention in its broader aspects.

I claim:

1. A high-frequency energy converter comprising:

open-faced transmission line means having first and second conductor means with respective opposed surfaces, third conductor means having a surface joining said opposed surfaces, septum means extending from said third conductor means between said first and second conductor means, first end wall means conductivity fixed adjacent one end of said transmission line means to said first and second conductor means, second end wall means insulating fixed adjacent a second end of said transmission line means to said first and second conductor means, hollow transmission line means coupled through said first end wall means in energy exchanging relation with said septum means, semiconductor means connected in series relation with said septum means and said second end wall means, circuit means for applying a bias field across said semiconductor means below its characteristic break down electric field, and impedance-matching means positioned between said first and second conductor means, said conductor means, said septum means, said end wall means, said impedance-matching means, and said bias circuit means impedance-matching means, so constructed so arranged as to permit high-efficiency-mode energy conversion operation of said semiconductor means in the presence of high-frequency energy within said transmission line means.

2. Apparatus as described in claim 1 wherein said first and second conductor means comprise planar conductors in substantially parallel relation.

3. Apparatus as described in Claim 2 wherein said third conductor means comprises a planar conductor substantially perpendicular to said first conductor means.

4. Apparatus as described in Claim 1 wherein said septum means is substantially parallel to said first conductor means.

5. Apparatus as described in Claim 1 wherein said semiconductor means comprises an avalanche transit time diode.

6. Apparatus as described in claim 1 wherein said impedance-matching means comprises three discrete impedance-matching elements, at least one of which is longitudinally adjustable in position within said open-faced transmission line means.

7. Apparatus as described in Claim 1 wherein said impedance-matching means comprises a conductive impedance-matching element having leg portions respectively in contact with said first and second conductor means and a bridging portion overlying said septum means.

8. Apparatus as described in Claim 7 wherein said conductive impedance-matching element is affixed to one of said first and second conductor means.

9. Apparatus as described in Claim 1 wherein said impedance-matching means comprises a dielectric impedance-matching element having leg portions respectively in contact with said first and second conductor means and said septum means.

10. Apparatus as described in Claim 9 wherein said dielectric impedance-matching element is adjustably affixed to one of said first and second conductor means.

11. Apparatus as described in Claim 1 wherein said conductor means, said septum means, said end wall means, said impedance-matching means, and said bias circuit means are so constructed and so arranged as to provide oscillating high-frequency energy with strong fundamental and harmonic components across said semiconductor means.